(12) United States Patent
Noelscher et al.

(10) Patent No.: US 7,370,313 B2
(45) Date of Patent: May 6, 2008

(54) METHOD FOR OPTIMIZING A PHOTOLITHOGRAPHIC MASK

(75) Inventors: Christoph Noelscher, Dresden (DE); Bernd Kuechler, Dresden (DE); Roderick Koehle, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 310 days.

(21) Appl. No.: 11/200,256

(22) Filed: Aug. 9, 2005

(65) Prior Publication Data
US 2007/0038972 A1 Feb. 15, 2007

(51) Int. Cl.
G06F 17/50 (2006.01)
(52) U.S. Cl. .............................. 716/21; 716/10; 716/19
(58) Field of Classification Search .................. 716/10, 716/19, 21
See application file for complete search history.

(56) References Cited

U.S. PATENT DOCUMENTS

| 4,592,648 | A * | 6/1986 | Tabarelli et al. ............... 355/43 |
| 5,432,607 | A * | 7/1995 | Taubenblatt ................. 356/364 |
| 5,680,588 | A | 10/1997 | Gortych et al. |
| 6,563,566 | B2 | 5/2003 | Rosenbluth et al. |
| 6,631,511 | B2 * | 10/2003 | Haffner et al. ................. 716/21 |
| 2003/0198158 | A1 * | 10/2003 | Roh et al. ................. 369/53.14 |
| 2006/0048091 | A1 * | 3/2006 | Joshi et al. .................... 716/21 |

FOREIGN PATENT DOCUMENTS

| DE | 100 44 257 A1 | 4/2002 |
| EP | 1 239 331 A2 | 9/2002 |
| JP | 07-029813 | 1/1995 |

OTHER PUBLICATIONS

Fukuda, H., et al., "Spacial Filtering for Depth of Focus and Resolution Enhancement in Optical Lithography," J. Vac. Sci. Technol. B9 (6), Nov./Dec. 1991, pp. 3113-3116.
Cobb, N.B., "Fast Optical and Process Proximity Correction Algorithms for Integrated Circuit Manufacturing," Dissertation, Graduate Division of the University of California at Berkeley (Spring 1998) pp. 1-123.
Erdmann, A., et al., "Mask and Source Optimization for Lithographic Imaging Systems," Proc. of SPIE, vol. 5182 (Aug. 2003) 14 pgs.
Fukuda, H., et al., "Improvement of Defocus Tolerance in a Half-Micron Optical Lithography by the Focus Latitude Enhancement Exposure Method: Simulation and Experiment," J. Vac. Sci. Technol. B7 (4) (Jul./Aug. 1989) pp. 667-674.
Hopkins, H.H., "On the Diffraction Theory of Optical Images," Proceedings of the Royal Soceity of London, vol. 217, Cambridge University Press (May 1953) pp. 408-432.
Rosenbluth, A.E., et al., "Optimum Mask and Source Patterns to Print a Given Shape," Proc. of SPIE, vol. 4346 (2001) pp. 486-502.
Socha, R., et al., "Contact Hole Reticle Optimization by Using Interference Mapping Lithography (IML™)," Proc. of SPIE, vol. 5377, (2004) pp. 222-240.
Sugiyama, S., et al., "New 5X i-line Projection Aligner for VLSI Fabrication," SPIE, vol. 922, Optical Laser Microlithography (1988) pp. 318-326.

* cited by examiner

*Primary Examiner*—Sun James Lin
(74) *Attorney, Agent, or Firm*—Slater & Matsil, L.L.P.

(57) ABSTRACT

The invention relates to a method for optimizing a mask layout pattern comprising at least one structural feature. First a desired layout pattern is provided. Based on the desired layout pattern, an optimized reference diffraction coefficient is provided. After selecting an initial mask geometry having polygon-shaped structures, initial diffraction coefficients are calculated. A difference based on the reference diffraction coefficient and initial diffraction coefficients is used to optimize the initial geometry in order to provide a mask layout pattern.

49 Claims, 4 Drawing Sheets

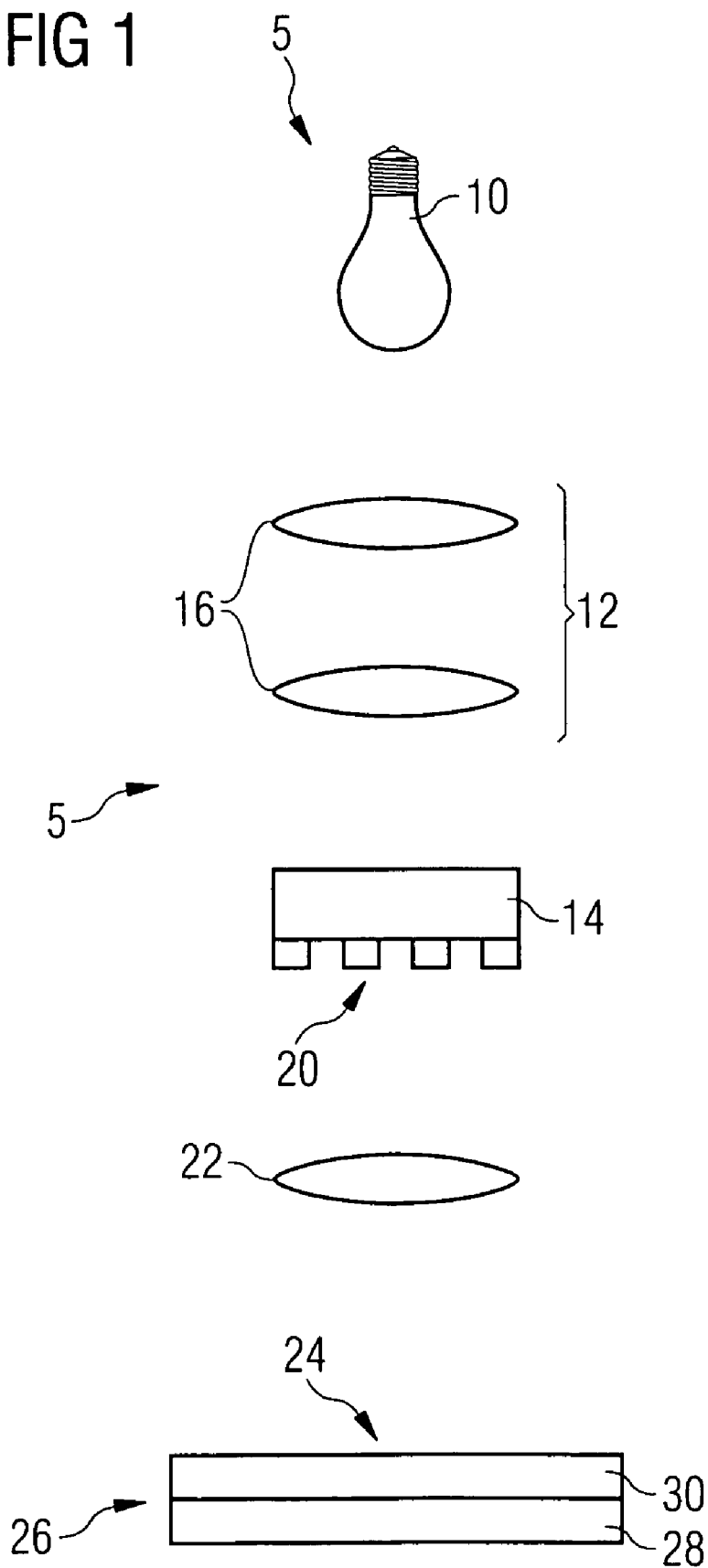

FIG 2A
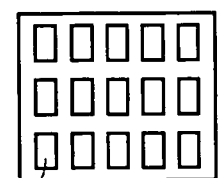
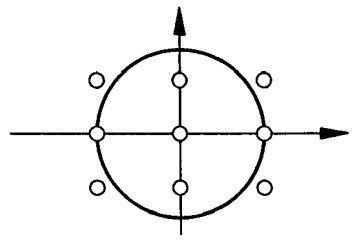
FIG 2B
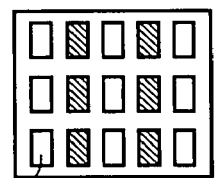
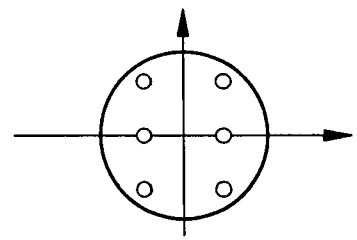
FIG 2C
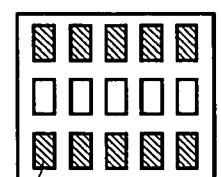
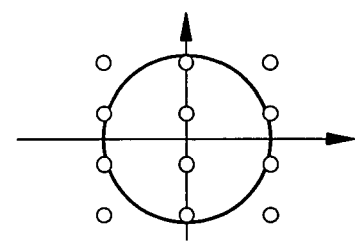
FIG 2D
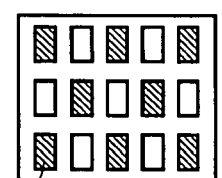
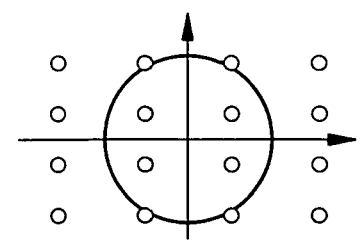

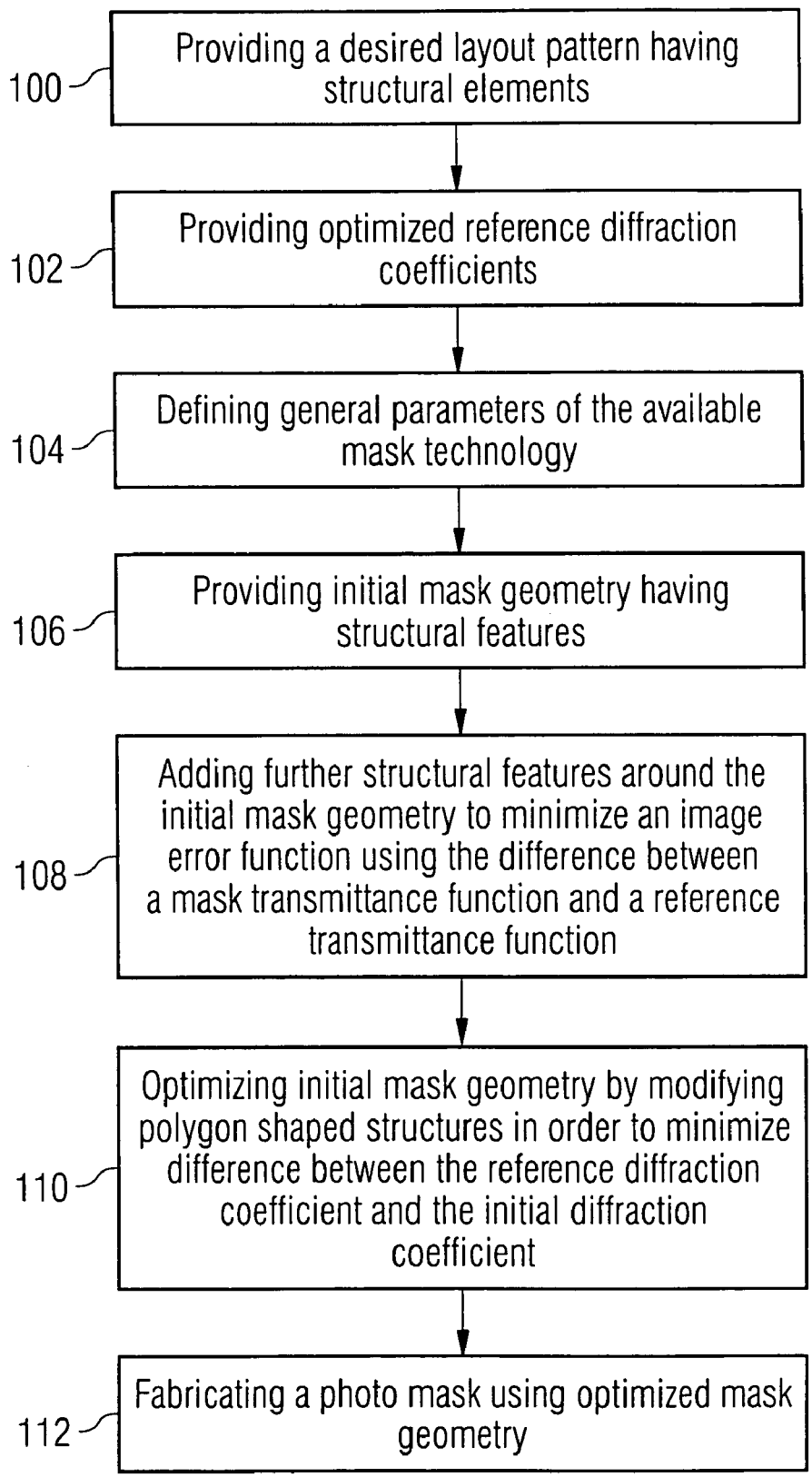

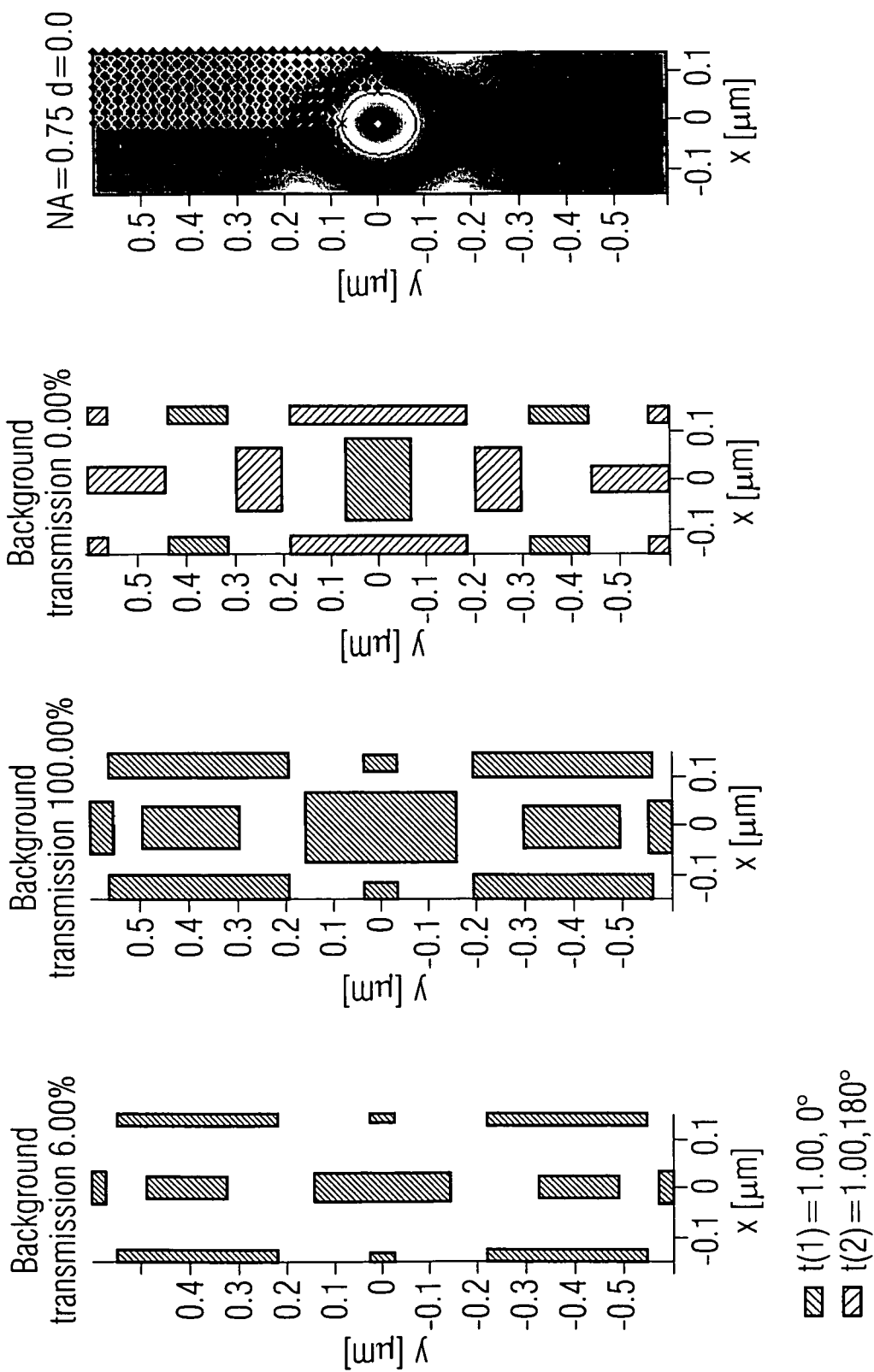

METHOD FOR OPTIMIZING A PHOTOLITHOGRAPHIC MASK

TECHNICAL FIELD

The invention relates generally to photolithographic processing and, in one example, to a method for optimizing a photolithographic mask and using such a mask in a semiconductor process.

BACKGROUND

The manufacturing of integrated circuits aims for continuously decreasing feature sizes of the fabricated components. Semiconductor manufacturing includes repeatedly projecting a pattern in a lithographic step onto a semiconductor wafer and processing the wafer to transfer the pattern into a layer deposited on the wafer surface or into the substrate of the wafer. This processing includes depositing a resist film layer on the surface of the semiconductor substrate, projecting a photo mask with the pattern onto the resist film layer and developing or etching the resist film layer to create a resist structure.

The resist structure is transferred into a layer deposited on the wafer surface or into the substrate in an etching step. Planarization and other intermediate processes may further be necessary to prepare a projection of a successive mask level. Furthermore, the resist structure can also be used as a mask during an implantation step. The resist mask defines regions in which the electrical characteristics of the substrate are altered by implanting ions.

The pattern being projected is provided on a photo mask. The photo mask is illuminated by a light source having a wavelength ranging from ultraviolet (UV) light to deep-UV in modem applications. The part of the light that is not blocked or attenuated by the photo mask is projected onto the resist film layer on the surface of a semiconductor wafer using a lithographic projection apparatus. The lithographic projection apparatus comprises a projection lens that usually performs a reduction of the pattern contained on the photo mask, e.g., by a factor of four.

In order to manufacture patterns having line widths in the range of 90 nm or smaller, large efforts have to be undertaken to further enhance the resolution capabilities of a lithographic projection apparatus.

The achievable resolution is determined by several factors. In optical lithography the relationship between the maximal resolution $b_{min}$ and the influence of the projection is given by Rayleigh's law:

$$b_{min}=k_1 * \lambda/NA, \text{ with } k_1 > 0.25.$$

The maximal resolution $b_{min}$ of a dense line-space-grating is therefore dependent on a technology characterising coefficient $k_1$, the illumination wavelength $\lambda$ and the numerical aperture NA of the lens of the projection system. The maximal resolution $b_{min}$ corresponds to half of the period of the line-space-grating.

While the illumination wavelength $\lambda$ and the numerical aperture NA are fixed for a given generation of a lithographic projection technology, optimizing the illumination process and implementing so-called resolution enhancement techniques (RET) reduces the technology characterising coefficient $k_1$ and thus improves the resolution capabilities of the lithographic projection apparatus.

Currently, there are two concepts known in the art that address the problem of increasing the resolution capabilities. First, off-axis illumination in the projection system of the projection apparatus together with sub-resolution sized assist features is used. Second, the concept of alternating phase shift masks is employed so as to enhance the resolution capabilities of the projection apparatus. Off-axis illumination is achieved by providing an annular-, quasar- or dipole-shaped aperture stop, thus enhancing contrast and depth of focus of densely spaced patterns. However, off-axis illumination impairs imaging of isolated structures. In order to allow imaging of isolated structures, sub-resolution sized assist features are used, which facilitate the resolution of these structures.

In order to achieve dimensional accuracy of the mask pattern during imaging, the sub resolution sized assist features are determined using a simulation model of the photolithographic projection. As discussed in N. Cobb, "Fast Optical and Process Proximity Correction Algorithms for Integrated Circuit Manufacturing," PhD thesis, University of California, Berkeley (USA), 1998, which is incorporated herein by reference, a model-based OPC simulation uses a simulation model for imaging structural elements of the photo mask onto a photo resist layer. In order to perform this calculation, a model for forming an aerial image, a model of the resist exposure, and for the photo mask is provided.

The result of the simulation is returned to the layout program so as to alter the geometric structures on the mask. In order to alter the structural elements, a fragmentation into individual structures is performed. Each fragment is optimized individually, leaving the process of optimizing as a feedback problem.

In the field of simulation for lithography other concepts have been developed, which are aiming at a formulation of the imaging problem as a numerical optimization problem. The result of the optimizing step is provided as a mask layout being substantially independent of the geometry of the initial mask.

As discussed by A. Rosenbluth et al., "Optimum Mask and Source Patterns to Print a Given Shape," Proceedings of SPIE Vol. 4346 (2001), pages 486 to 502, which is incorporated herein by reference, optimizing the geometry of the structural elements of the mask together with the illumination source can be achieved by calculating a respective source distribution in order to enlarge the available process window.

Similar to the above document, U.S. Pat. No. 6,563,566, which is incorporated herein by reference, discusses an optimized illumination source and reticle are discussed. The process of optimizing both illumination and mask pattern allows the development of mask patterns that are not constrained by the geometry of the desired pattern to be printed. The resulting mask patterns using the process of optimizing do not obviously correspond to the desired patterns to be printed. Such masks may include phase-shifting technology that use destructive interference to define dark areas of the image and are not constrained to conform to the desired printed pattern.

The process of a simplified global optimization step according to U.S. Pat. No. 6,563,566, which is incorporated herein by reference, can be represented as a generalized fractional program. Although techniques are known in the art for solving fractional optimization problems, it can be approximated as a cubic polynomial optimization, and solved, for example, by a homotopy method. An approximate solution scheme is used that exploits the fact that two simplified variants are more readily solvable. First, if the diffracted wave front orders are fixed, it is possible to find the globally optimum solution for the source intensities. Second, if illuminating light is incident from only a single direction, the optimization problem reduces to a non-convex quadratic optimization problem.

Another approach for describing the imaging problem and for optimizing the lithographic projection step is discussed in A. Erdmann et al., "Mask and Source Optimization for Lithographic Imaging Systems," Proceedings of SPIE Vol. 5182 (2003), pages 88 to 102, which is incorporated herein by reference. There, a genetic algorithm is used, which is based on an analytical merit function describing weighted contributions of line width discrepancies, slopes of mask transmittance distributions, higher order diffraction patterns and mask structural elements. The merit function is used to perform a non-analytical global optimization.

The above-described methods use rather complex and therefore computing time intensive algorithms to achieve the desired optimizing step.

SUMMARY OF THE INVENTION

In one aspect, the invention provides a method for optimizing a photolithographic mask with reduced optimization time. In a further aspect, the invention provides methods for optimizing a photolithographic mask being capable of optimizing complex phase shifting mask types.

These and other aspects together with technical advantages are generally achieved by embodiments of the present invention that provide for a method for optimizing a photolithographic mask. A desired layout pattern includes at least one structural feature. An imaging model of a photolithographic apparatus includes an illumination source parameter of an illumination source of the photolithographic apparatus and a lens aperture. At least one optimized reference diffraction coefficient based on the desired layout pattern and the source parameter of the illumination source is provided for imaging relevant diffraction orders of the illumination source passing the lens aperture. An initial mask geometry is parameterized having polygon-shaped structures. At least one initial diffraction coefficient based on the initial mask geometry is also provided. A difference is determined based on the optimized reference diffraction coefficient and the initial diffraction coefficient. The initial mask geometry is optimized by modifying the polygon-shaped structures so as to form an optimized mask pattern by minimizing the difference. A photolithographic mask has a translucent substrate and is capable to accommodate at least one structural element being light-attenuating and phase-shifting when illuminated by the illumination source. The at least one light-attenuating phase-shifting structural element is provided on the photo mask in accordance with the optimized mask pattern.

In another embodiment, a desired layout pattern includes at least one structural feature and an imaging model of a photolithographic apparatus includes an illumination source parameter of an illumination source of the photolithographic apparatus and a lens aperture. At least one optimized reference diffraction coefficient based on the desired layout pattern and source parameter of the illumination source is provided for imaging relevant diffraction orders of the illumination source passing the lens aperture. An initial mask geometry is parameterized having polygon-shaped structures and selected so as to obey a certain mask technology. At least one initial diffraction coefficient based on the initial mask geometry is provided. A relationship between the initial diffraction coefficient and a mask transmittance function ($t_o$) during illumination with electromagnetic radiation is emitted by the illumination source. The mask transmittance function is determined based on the initial diffraction coefficient by using the relationship. A further relationship between the optimized reference diffraction coefficient and a reference transmittance function is provided during illumination with electromagnetic radiation emitted by illumination source. The reference transmittance function is determined based on the optimized reference diffraction coefficient by using the further relationship, and an image error function is determined based on the mask transmittance function and the reference transmittance function. Further structural elements are added as further polygon-shaped structures to the initial mask geometry by minimizing the image error function so as to form a modified mask geometry. The modified mask geometry is optimized by modifying the polygon-shaped structures and the further polygon-shaped structures so as to form an optimized mask pattern by minimizing a difference between the optimized reference diffraction coefficient and a modified diffraction coefficient based on the modified mask geometry. A photolithographic mask is provided that is patterned in accordance with the optimized mask pattern.

Another embodiment provides a method for optimizing a photolithographic mask including a desired layout pattern that includes at least one structural feature. A plurality of optimized reference diffraction coefficients is provided as a series of Fourier-coefficients and is based on the desired layout pattern, the optimized reference diffraction coefficients associated with different diffraction orders. A subset of optimized reference diffraction coefficients is selected by a lens aperture of a photolithographic apparatus. An initial mask geometry is provided and is parameterized having polygon-shaped structures. A plurality of initial diffraction coefficients is provided as a series of Fourier-coefficients based on the initial mask geometry. A mask transmittance function described as a Fourier transformation of the initial diffraction coefficients, and a reference transmittance function described as a Fourier transformation of the subset of optimized reference diffraction coefficients are determined. An image error function is determined based on the mask transmittance function and the reference transmittance function. Further structural elements are added as further polygon-shaped structures to the initial mask geometry by minimizing the image error function so as to form a modified mask geometry. The modified mask geometry is optimized by modifying the polygon-shaped structures and the further polygon-shaped structures so as to form an optimized mask pattern by minimizing a difference between the subset of optimized reference diffraction coefficients and modified diffraction coefficients based on the modified mask geometry. A photolithographic mask is provided and is patterned in accordance with the optimized mask pattern.

Another embodiment provides a computer program product for optimizing a photolithographic mask including computer readable instructions so as to cause a computer to store a desired layout pattern including at least one structural feature. An imaging model of a photolithographic apparatus is stored including an illumination source parameter of an illumination source of the photolithographic apparatus and a lens aperture. At least one optimized reference diffraction coefficient based on the desired layout pattern and the source parameter of the illumination source for imaging relevant diffraction orders of the illumination source passing the lens aperture, an initial mask geometry parameterized having polygon-shaped structures, and at least one initial diffraction coefficient based on the initial mask geometry, are also stored. A difference is determined based on the optimized reference diffraction coefficient and the initial diffraction coefficient. The initial mask geometry is optimized by modifying the polygon-shaped structures so as to form an optimized mask pattern by minimizing the difference, and the optimized mask pattern is stored.

Yet another embodiment provides a storage medium being readable for a computer and having stored computer readable instructions to perform a program on the computer for optimizing a photolithographic mask, including a desired layout pattern that includes at least one structural feature. An imaging model of a photolithographic apparatus including an illumination source parameter of an illumination source of the photolithographic apparatus and a lens aperture, at least one optimized reference diffraction coefficient based on the desired layout pattern and the source parameter of the illumination source for imaging relevant diffraction orders of the illumination source passing the lens aperture, an initial mask geometry parameterized having polygon-shaped structures, and at least one initial diffraction coefficient based on said initial mask geometry are stored. A difference is determined based on the optimized reference diffraction coefficient and the initial diffraction coefficient. The initial mask geometry is optimized by modifying the polygon-shaped structures so as to form an optimized mask pattern by minimizing the difference. The optimized mask pattern is also stored.

Another embodiment provides a lithographic projection system including a means for providing a desired layout pattern including at least one structural feature, and a means for providing an imaging model of a photolithographic apparatus including an illumination source parameter of an illumination source of the photolithographic apparatus and a lens aperture. A means for providing at least one optimized reference diffraction coefficient based on the desired layout pattern and the source parameter of the illumination source for imaging relevant diffraction orders of the illumination source passing the lens aperture, a means for providing an initial mask geometry parameterized having polygon-shaped structures, a means for providing at least one initial diffraction coefficient based on the initial mask geometry, a means for providing determining a difference based on the optimized reference diffraction coefficient and the initial diffraction coefficient, a means for providing optimizing the initial mask geometry by modifying the polygon-shaped structures so as to form an optimized mask pattern by minimizing the difference, and a means for providing a layout pattern, the layout pattern comprising at least one structural feature, are also included. A photolithographic mask having a translucent substrate and capable to accommodate at least one structural element being light-attenuating and phase-shifting when illuminated and fabricated in accordance with the optimized mask pattern is provided. A substrate coated with a light sensitive layer, and a photolithographic apparatus including the illumination source and capable of accommodating the substrate and the photo mask in accordance with the optimized mask pattern are also provided.

Another embodiment provides a method for optimizing a mask layout pattern, including a first description of a desired layout pattern using optimized diffraction coefficients. A second description of an initial geometry is provided that is parameterized having polygon-shaped structures using initial diffraction coefficients. The first description and the second description are equalized by modifying the polygon-shaped structures. The modified polygon-shaped structures of the initial geometry are stored, and a photo mask having structural elements is fabricated in accordance with the optimized initial geometry.

Yet another embodiment provides a method for photolithographically patterning a substrate wherein a desired layout pattern is provided that includes at least one structural feature. An imaging model of a photolithographic apparatus is provided including an illumination source parameter of an illumination source of the photolithographic apparatus and a lens aperture. At least one optimized reference diffraction coefficient is provided based on the desired layout pattern and the source parameter of the illumination source for imaging relevant diffraction orders of the illumination source passing the lens aperture. An initial mask geometry parameterized having polygon-shaped structures, at least one initial diffraction coefficient based on the initial mask geometry, are also provided. A difference is determined based on the optimized reference diffraction coefficient and the initial diffraction coefficient. The initial mask geometry is optimized by modifying the polygon-shaped structures so as to form an optimized mask pattern by minimizing the difference. The optimized mask pattern is stored. A photo mask having structural elements is fabricated in accordance with the optimized mask pattern. A substrate coated with a light sensitive layer, and a photolithographic apparatus capable of accommodating the substrate and the photo mask in accordance with the optimized initial geometry are provided. The substrate is patterned using the photolithographic apparatus and the photo mask.

BRIEF DESCRIPTION OF THE DRAWINGS

The above features of the present invention will be more clearly understood from consideration of the following descriptions in connection with accompanying drawings in which:

FIG. 1 schematically illustrates an arrangement comprising an exposure tool with a wafer and a photo mask in a side view;

FIGS. 2A to 2D show layout patterns according to an embodiment of the invention;

FIG. 3 schematically illustrates method steps of one embodiment of the invention; and FIG. 4 schematically illustrates optimized mask layouts according to an embodiment of the invention.

DETAILED DESCRIPTION OF ILLUSTRATIVE EMBODIMENTS

A presently preferred embodiment of the methods and the lithographic system according to the invention is discussed in detail below. It is appreciated, however, that the present invention provides many applicable inventive concepts that can be embodied in a wide variety of specific contexts. The specific embodiments discussed are merely illustrative of specific ways to apply the method and the system of the invention, and do not limit the scope of the invention.

In the following, embodiments of the method and the system are described with respect to improving dimensional accuracy during lithographic projection of a layer of an integrated circuit. The invention, however, might also be useful for other products, e.g., liquid crystal panels or the like.

With respect to FIG. 1, a set-up of a lithographic projection apparatus 5 in a side view is shown. It should be appreciated that FIG. 1 merely serves as an illustration, i.e., the individual components shown in FIG. 1 neither describe the full functionality of a lithographic projection apparatus 5 nor are the elements shown true scale.

The projection apparatus 5 comprises an illumination source 10, which is, e.g., an Excimer laser emitting electromagnetic radiation having a wavelength of 193 nm. An illumination optics 12 projects the light coming from the light source 10 through a photo mask 14 into an entrance pupil of the projection system. The illumination optics 12 can be formed of several lenses 16. As shown in FIG. 1, lenses 16 are arranged between the light source 10 and photo mask 14.

The photo mask 10 comprises a mask pattern 18, i.e. being composed of light absorptive or light attenuating elements 20. Light absorptive elements can be provided by, e.g., chrome elements. Light attenuating elements can be provided by, e.g., molybdenum-silicate elements.

The light passing the photo mask 14, i.e., the light not being blocked or attenuated by the above-mentioned elements, is projected by a projection lens 22 of the projection system onto the surface 24 of a semiconductor wafer 26. The pattern projected on the semiconductor wafer 26 is usually scaled down, e.g. by factor of 4.

The semiconductor wafer 26 has a semiconductive region, e.g., a substrate, 28 onto which a photo resist film layer 30 is deposited onto which the mask pattern 18 is projected. After developing the photo resist film 30 layer a three-dimensional resist pattern is formed on the surface of the substrate 28 by removing those parts of the photo resist film layer 30 that are exposed with an exposure dose above the exposure dose threshold of the resist film layer 30.

Referring now to FIG. 2A, a layout pattern 40 is shown that has a plurality of structural elements 42. The layout pattern 40 is provided, e.g., by a computer program. In this particular example, each of structural elements 42 is a rectangular-shaped pattern having a characteristic feature size. The characteristic feature size can be described by the width and the length of the rectangular-shaped patterns. In other embodiments, other shapes are possible.

Similar to alternating phase shift masks, it is possible to provide a mask layout such that in one or two directions on the mask the structural elements 42 are arranged periodically. In other words, the structural elements 42 have the same intensity but with respect to the adjacent structural elements 42 a 180° phase shift. The alternating periodic arrangement of structural elements 42 can be selected independent in x and y-directions yielding to layout patterns as shown in the left hand side of FIGS. 2B, 2C and 2D. Generally, this is possible for similar but not for arbitrary geometries.

For the periodic grid of structural elements 42 of layout pattern 40, the period in the x-direction is described by variable P and in the y-direction by variable Q. Within the grid, the layout pattern 40 can have a non-periodic or asymmetric substructure. When optimizing the layout pattern at a certain target position, a section around the target position can be selected so as to provide a periodic grid.

The periodic grid of layout pattern 40 acts as a grating element and during illumination of a photo mask 14 fabricated in accordance with the layout pattern 40, diffraction occurs. For a photo mask 14 having a pattern as shown in FIGS. 2B, 2C and 2D, diffraction orders having an even value are erased. Accordingly, the diffraction spectra as shown in the right hand part of FIGS. 2A to 2D are different with respect to each other.

In the following, embodiments of the invention are described with respect to different illumination conditions. As will be shown below, a coherent illumination yields to a linear optimizing problem. Further, partially coherent illumination and multiple exposure techniques will be discussed.

The general procedure is outlined in FIG. 3. Starting from the desired layout pattern 40 having the structural elements 42 in step 100, optimized reference diffraction coefficients are provided in step 102. This includes providing optimized reference diffraction coefficients according to an optimization procedure, e.g. the optimization as described in the disclosure by A. Rosenbluth et al., "Optimum Mask and Source Patterns to Print a Given Shape," Proceedings of SPIE Vol. 4346 (2001), pages 486 to 502, which is incorporated herein by reference. Other possible optimization procedures are described below. According to the optimization procedure of A. Rosenbluth et al., the steps of global optimization of a simplified merit function, local optimization to refine the global solution, and combining the selected source directions, source intensities and mask within a lithographic projection system are performed.

At that point of the method according to an embodiment of the invention, the desired layout pattern is described by the optimized reference diffraction coefficients. Due to lens apertures only a limited amount of orders of diffraction actually pass the lithographic apparatus, the optimized reference diffraction coefficients are limited to the relevant diffraction orders.

In step 104, general parameters of the available mask technology are defined. This includes the definition of the alternating elements, selecting one or more transmission values for the structural elements 42 or other geometrical constraints associated to the photo mask 14.

In the next step 106, an initial geometry is provided. The initial mask geometry serves as a starting point for a further optimization procedure. The initial mask geometry contains structural features described in accordance with the above-defined mask technology.

The initial mask geometry can be described by initial diffraction coefficients as well. In other words, two hologram pictures are calculated using both the optimized reference diffraction coefficients being limited to the relevant diffraction orders and the initial diffraction coefficients. The latter are not restricted to the relevant diffraction orders.

A first refinement of the initial mask geometry is provided in step 108. This is performed by calculating a mask transmittance function based on the initial diffraction coefficients and a reference transmittance function based on the optimized reference diffraction coefficients. Furthermore, an image error function is calculated using the difference between the mask transmittance function and the reference transmittance function. Adding further structural features around the initial mask geometry minimizes the image error function.

In step 110, an optimization procedure based on the optimized reference diffraction coefficients and the initial diffraction coefficients is carried out. The idea is to provide a mask layout pattern based on the initial mask geometry that equalizes the hologram pictures.

The optimization is carried out by modifying the polygon-shaped structures. In order to achieve the desired minimal deviation a difference is calculated being based on the normalized optimized reference diffraction coefficient and the normalized initial diffraction coefficient. By modifying the initial geometry and the further structural elements the difference is minimized.

The resulting optimized mask geometry is used in step 112 for fabricating the photo mask.

Considering a periodic grid of structural elements 42 of layout pattern 40, the period in the x-direction is described by variable P and in the y-direction by variable Q. For a given mask technology, a mask transmittance function t(x, y) can be calculated. In general, the mask transmittance function t(x, y) can have complex values. In the further discussion, only real values are considered, wherein negative values describe a 180° phase shift when illuminated by the illumination source 10 emitting electromagnetic radiation.

Furthermore, an optimized diffraction coefficient is calculated as a series of Fourier coefficients based on the mask transmittance function.

Referring again to FIG. 2A, the mask transmittance function t(x, y) of a periodic grating obeys the following relation:

$$t(x,y)=t(x+n \cdot P, y+m \cdot Q), \qquad [1]$$

with n and m being integer values.

For the alternating periodic grid in the x-direction, as described in FIGS. 2B and 2D, the mask transmittance function t(x, y) obeys the condition:

$$t(x,y)=(-1)^n \cdot t(x+n \cdot P, y+m \cdot Q). \qquad [2]$$

A similar condition can be formulated for the alternating periodic grid in the y-direction as well. In general, all alternating periodic grids as shown in FIGS. 2A and 2B can be described.

The electromagnetic radiation illuminating the periodic grid can be described by a plane electromagnetic wave that is inclining perpendicular to the periodic grid. The periodic grid acts as a grating element. During illumination diffraction occurs. The diffracted electromagnetic wave behind the periodic grid has a field strength that is described as decomposition into individual plane waves using the following relationship:

$$t(x, y) = \sum_{k,l=-\infty}^{\infty} c_{k,l} \exp\left[j\frac{2\pi}{\lambda}(x \cdot u_k + y \cdot v_l)\right]. \qquad [3]$$

The index values k and l are both integer numbers and describe different orders of diffraction.

For the periodic grid, the directions of propagation of the electromagnetic wave are given by:

$$u_k = \frac{\lambda}{P}k, \ v_l = \frac{\lambda}{Q}l. \qquad [4a, 4b]$$

For the alternating grid (FIGS. 2B and 2C), order of diffraction is shifted by half a diffraction order. Accordingly, the directions of propagation of the electromagnetic wave are given by:

$$u_k = \frac{\lambda}{P}\left(k+\frac{1}{2}\right), \ v_l = \frac{\lambda}{Q}l. \qquad [5]$$

Consider now the Fourier transformation as given by:

$$T(f_x, f_y) = \int_{-P/2}^{P/2}\int_{-Q/2}^{Q/2} t(x, y) \cdot \exp[-j2\pi(x \cdot f_x + y \cdot f_y)]dxdy, \qquad [6]$$

The diffraction coefficients are calculated using the following formula:

$$c_{k,l} = \frac{1}{PQ}T(u_k/\lambda, v_l/\lambda). \qquad [7]$$

According to an embodiment of the invention, the Fourier coefficients are determined by inspecting the Fourier transformation $T(f_x, f_y)$.

As for an example, only real values are considered for the mask transmittance function t(x, y), the Fourier coefficients $c_{k,l}$ have the following symmetries:

$$c_{k,l}=c^*_{-k,-l}. \qquad [8]$$

During illumination, only diffraction orders that fall within the numerical aperture of the projection lens propagate to the semiconductor substrate. For coherent illumination, the diffraction orders that contribute to the imaging are given by:

$$\sqrt{u_k^2+v_l^2}<NA \qquad [9]$$

For partial coherent illumination, which is usually described by a filling factor σ, the diffraction orders contributing to imaging on the resist film layer are given by:

$$\sqrt{u_k^2+v_l^2}<NA \cdot (1+\sigma) \qquad [10]$$

When calculating diffraction coefficients, only the above-described contributing orders have to be taken into account, as these diffraction coefficients describe the resulting image on the semiconductor substrate. In principle, the remaining diffraction orders can have arbitrary values. Mathematically, the imaging problem is over-determined, as an infinite amount of possible solutions lead to the same result. The diffraction coefficients not contributing to the imaging, however, play an important role when the resulting mask transmittance function is transferred into a photo mask that should contain features with manufacturability in the respective mask technology.

The optimization of the photo mask starts with providing an initial geometry of the layout pattern. The initial geometry is parameterized having polygon-shaped structures. The polygon-shaped structures can have further constraints, e.g., with respect to their minimal length or discrete values for the corners. This automatically assures a photo mask that can be manufactured.

In order to calculate a mask transmittance function based on the initial geometry, the relationship as shown in equation [3] is used. To achieve a normalization of the dose of the illumination source, which is a parameter being freely selectable, a reference point on the photo mask, being denoted with $x_0$ and $y_0$, is selected. By providing a value of the mask transmittance function, a normalized intensity of the electromagnetic radiation at the reference point is achieved.

Furthermore, the desired layout pattern is taken into account by providing reference diffraction coefficients $C_{Ref}$ based on the layout pattern. A reference transmittance function $t_{Ref}$ based on the reference diffraction coefficients $C_{Ref}$ is determined, using again a relationship similar to equation [3].

In the next step, the initial geometry is optimized so as to resemble the desired layout pattern. More specifically, the initial geometry is attributed by coefficient $C_0$. Performing a normalization of the dose value leads to the following equations for mask transmittance function of the initial geometry and the target or reference transmittance function:

$$t_0 = t_{C0}(x_0, y_0) = \sum_{k,l} C_0(k, l) \cdot \exp\left[j\frac{2\pi}{\lambda}(x_0 \cdot u_k + y_0 \cdot v_l)\right] \quad [11a\text{-}11d]$$

$$t_{ref} = t_{Cref}(x_0, y_0) = \sum_{k,l} C_{Ref}(k, l) \cdot \exp\left[j\frac{2\pi}{\lambda}(x_0 \cdot u_k + y_0 \cdot v_l)\right],$$

$$\hat{C}_0 = C_0/t_0, \quad \hat{C}_{ref} = C_{ref}/t_{ref}$$

By subtracting both transmittance functions, an error function is determined:

$$\Delta t(x, y) = \sum_{k,l} [C_0(k, l) - C_{ref}(k, l)] \cdot \exp\left[j\frac{2\pi}{\lambda}(x \cdot u_k + y \cdot v_l)\right] \quad [12]$$

Based on this error function, the initial geometry is optimized by modifying the polygon-shaped elements or introducing new elements as further structural features. This optimization procedure is performed iteratively, until a certain predetermined difference between the reference transmittance function and the mask transmittance function is achieved.

A further refinement is achieved by optimizing the difference between normalized diffraction coefficients as given by:

$$\Delta = \|\hat{C}_0 - \hat{C}_{ref}\|^2 \rightarrow \min. \quad [13]$$

The optimization method according to the above embodiment has the benefit, that the error function gives a direct relation to the specific point where further improvement is necessary. Accordingly, even complex mask technologies with complex patterns can be optimized in a reasonable low processing time, when implementing the above optimization method in a computer system or the like. As a result, an optimized mask transmittance function, which minimizes the error function, is determined. The optimized mask transmittance function serves as a basis for providing light-attenuating phase-shifting structural elements on the photo mask in accordance to the optimized initial geometry.

An example of a result of the optimization is shown in FIG. 4. In FIG. 4, three optimized layout patterns of one tile of a contact hole chain are shown that should be transferred by the photo mask onto the resist film layer. Besides the main structural feature in the center, several additional elements are shown as described above. The Fourier spectrum (hologram picture), which is based on the reference diffraction coefficients, is shown as well.

The optimization method according to the above embodiment can be applied to different mask technologies including but not limited to semi-transparent phase shift masks, semi-transparent phase shift masks having at least two areas with different transmittance, chrome-less phase shift masks, Triton phase shift masks, semi-transparent phase shift masks with rim-type elements and phase shift masks alternating phase shifting elements.

Another feature of the invention is related to the fact that a coherent light source is taken into account. For coherent light sources the step of providing the optimized reference diffraction coefficients can be formulated as a linear optimization problem.

The linear optimization problem starts from a target function, which describes a desired image contrast when illuminating the photo mask using the optimized geometry. By providing a constraint function for the linear optimization problem, the initial geometry is optimized using the constraint function and the target function. Advantageously, the constraint function and the target function are defined as linear functions.

More specific, the electrical field strength f is given by the following relationship, again considering the case of alternating periodic grids of the layout pattern.

$$f(x, y; z) = \sum_{k,l} c_{k,l} \cdot \exp\left[j\frac{2\pi}{\lambda}(x \cdot u_k + y \cdot v_l + z \cdot w_{k,l})\right] \quad [14]$$

The electrical field can be also determined at a defocus depth z. The phase contribution $w_{k,l}$ is calculated by $$w_{k,l} = \sqrt{1 - u_k^2 - v_l^2}. \quad [15]$$

By calculating the square of equation [14], the intensity is determined:

$$I(x,y) = |f(x,y)|^2 = f(x,y)f^*(x,y) \quad [16]$$

The constraint functions can, for the linear problem, directly be applied to the field strength by using:

$$I(x_b, y_b) > I_{bright}$$

$$I(x_d, y_d) < I_{dark}$$

$$I(x_t, y_t) = I_{target}, \quad [17a\text{-}c]$$

with $I_{bright}$ an intensity above a certain threshold, $I_{dark}$ an intensity below a certain threshold and $I_{target}$ an intensity having the desired intensity.

Using these equations to determine in the following the coherent for the field strength, the constraint functions are given by:

$$f(x_b, y_b) > \sqrt{I_{bright}}$$

$$f(x_b, y_b) < -\sqrt{I_{bright}}$$

$$f(x_d, y_d) < \sqrt{I_{dark}}$$

$$f(x_d, y_d) > -\sqrt{I_{dark}}$$

$$f(x_t, y_t) = \sqrt{I_{target}} \quad [18a\text{-}e]$$

As described above, a target function can be provided using the contrast of the image, e.g. as described by:

$$C(x_t, y_t) = \frac{1}{I(x_t, y_t)}\left(\frac{\partial I}{\partial x}dx + \frac{\partial I}{\partial y}dy\right) = \frac{2}{f}\left(\frac{\partial f}{\partial x}dx + \frac{\partial f}{\partial y}dy\right) \quad [19]$$

The derivatives of the field strength in both directions are given by:

$$\frac{\partial f}{\partial x} = \sum_{k,l} j\frac{2\pi}{\lambda}u_k c_{k,l} \cdot \exp\left[j\frac{2\pi}{\lambda}(x \cdot u_k + y \cdot v_l + z \cdot w_{k,l})\right] \quad [20]$$

$$\frac{\partial f}{\partial y} = \sum_{k,l} j\frac{2\pi}{\lambda}v_l c_{k,l} \cdot \exp\left[j\frac{2\pi}{\lambda}(x \cdot u_k + y \cdot v_l + z \cdot w_{k,l})\right]$$

By calculating the contrast only for the target positions $(x_t, y_t)$ determining the contrast $C(x_t, y_t)$ using the diffraction coefficients is a linear transformation and thus a linear optimization problem, which greatly disburdens calculation.

In a further embodiment, a partially coherent light source is used. The step of optimizing the initial geometry is formulated using an imaging model similar to the optical model described in: H. H. Hopkins, "On the diffraction theory of optical images," in Proceedings of the royal society of London, Series A, Volume 217, No. 1131, pages 408-432, 1953, which is incorporated herein by reference.

There, the optical model is defined by an integral function, which is iteratively calculated using a product comprising an illumination aperture, a lens aperture and a complex lens aperture. As a result, a matrix of transmission cross coefficients is determined.

In order to solve the optimization problem, a relationship between the matrix of transmission cross coefficients and the mask transmittance coefficients are provided. As a result, a matrix of aerial image coefficients is calculated.

By using the matrix of aerial image coefficients, the initial geometry is optimized.

More specifically, the matrix of aerial image coefficients is based on the following relationship:

$$I_{m,n} = \sum_{i,j} T_{i+m,j+n} T_{i,j}^* \cdot TCC(i+m, j+n, i, j), \quad [21]$$

where the aerial image coefficients $I_{m,n}$ are indexed over the range $$-2\,NA\,P/\lambda \leq m \leq 2\,NA\,P/\lambda$$

$$-2\,NA\,Q/\lambda \leq n \leq 2\,NA\,Q/\lambda \quad [22a\text{-}b]$$

and the following index value for the diffraction coefficients $T_{i,j}$:

$$i = \max(-m_u, -m_u - m) \ldots \min(m_u, m_u - m)$$

$$j = \max(-m_v, -m_v - n) \ldots \min(m_v, m_v - n), \quad [23a\text{-}b]$$

where $$m_u = \text{floor}(NA(1+\sigma)P/\lambda) \text{ and}$$

$$m_v = \text{floor}(NA(1+\sigma)Q/\lambda) \quad [24a\text{-}b]$$

It should be noted that the function "floor" returns an integer value being the lower limit of the input value, which is here in general a non-integer value.

By using the matrix of aerial image coefficients, the aerial image intensities are determined by calculating the following Fourier series:

$$I(x, y) = \sum_{m,n} I_{m,n} \cdot \exp\left(j \frac{2\pi}{\lambda}(u_m x + v_n y)\right) \quad [25]$$

with $u_m$, $v_n$ as defined in equation [5].

Advantageously, the matrix of aerial image coefficients can be added for different exposures. For example, it is possible to optimize the initial geometry using different exposure conditions. These exposure conditions may include successive defocused illuminations. Furthermore, the matrix of transmission cross coefficients is further used to optimize the source parameter of the light source.

Having described embodiments of the invention, it is noted that modifications and variations can be made by persons skilled in the art in light of the above teachings. It is, therefore, to be understood that changes may be made in the particular embodiments of the invention disclosed that are within the scope and spirit of the invention as defined by the appended claims.

Having thus described the invention with the details and the particularity required by the patent laws, what is claimed and desired to be protected by Letters Patent is set forth in the appended claims.

What is claimed is:

1. A method for making a photolithographic mask, the method comprising:
   providing a desired layout pattern, said desired layout pattern comprising at least one structural feature;
   providing an imaging model of a photolithographic apparatus, said imaging model comprising an illumination source parameter of an illumination source of said photolithographic apparatus and a lens aperture;
   providing at least one optimized reference diffraction coefficient based on said desired layout pattern and said illumination source parameter of said illumination source for imaging relevant diffraction orders of said illumination source passing said lens aperture;
   providing an initial mask geometry, said initial mask geometry being parameterized having polygon-shaped structures;
   providing at least one initial diffraction coefficient based on said initial mask geometry;
   determining a difference based on said optimized reference diffraction coefficient and said initial diffraction coefficient;
   optimizing said initial mask geometry by modifying said polygon-shaped structures so as to form an optimized mask pattern by minimizing said difference;
   providing a photolithographic mask, said photolithographic mask having a translucent substrate and being capable to accommodate at least one structural element being light-attenuating and phase-shifting when illuminated by said illumination source; and
   providing the at least one light-attenuating phase-shifting structural element on said photolithographic mask in accordance with said optimized mask pattern.

2. The method according to claim 1, wherein the step of optimizing said initial mask geometry comprises providing further structural elements within said optimized mask geometry to minimize said difference.

3. The method according to claim 2, wherein the step of optimizing said initial mask geometry further comprises:
   providing a relationship between said initial diffraction coefficient and a mask transmittance function during illumination with electromagnetic radiation being emitted by said illumination source;
   determining said mask transmittance function based on said initial diffraction coefficient by using said relationship;
   providing a further relationship between said optimized reference diffraction coefficient and a reference transmittance function during illumination with electromagnetic radiation being emitted by said illumination source;
   determining said reference transmittance function based on said optimized reference diffraction coefficient by using said further relationship;
   determining an image error function between said reference transmittance function and said mask transmittance function within a two-dimensional area corresponding to said photolithographic mask;
   searching for regions within the two-dimensional area having an error above a predetermined value; and modifying said polygon-shaped structures and/or adding said further structural elements.

4. The method according to claim 3, wherein the step of optimizing said initial mask geometry is performed iteratively and for each iteration step said image error function between said reference transmittance function and said mask transmittance function is determined, said iterative optimization being terminated if said image error function is less than said predetermined value.

5. The method according to claim 3, wherein the step of determining said mask transmittance function based on said initial diffraction coefficient further comprises:
providing a reference point on said photolithographic mask;
selecting a value of said mask transmittance function so as to achieve a normalized intensity of said electromagnetic radiation at said reference point;
determining a normalized optimized reference diffraction coefficient; and
determining a normalized initial diffraction coefficient,
wherein the step of determining said difference is based on said normalized optimized reference diffraction coefficient and said normalized initial diffraction coefficient.

6. The method according to claim 1, wherein said optimized reference diffraction coefficient is determined as a series of Fourier-coefficients.

7. The method according to claim 1, wherein said initial diffraction coefficient is determined as a series of Fourier-coefficients.

8. The method according to claim 1, wherein said illumination source is a coherent light source.

9. The method according to claim 8, wherein said reference diffraction coefficient is formulated as a linear optimization problem.

10. The method according to claim 9, wherein said linear optimization problem comprises:
providing a target function, said target function describing a desired image contrast when illuminating said photolithographic mask using said optimized mask geometry;
providing at least one constraint function for said linear optimization problem; and
optimizing said initial mask geometry using said constraint function and said target function, wherein said constraint function and said target function are defined as linear functions.

11. The method according to claim 1, wherein said illumination source parameter of said illumination source describes a partially coherent light source.

12. The method according to claim 11, wherein said optimized reference diffraction coefficient is formulated using said imaging model that is further defined by an integral function, said integral function being iteratively calculated using a product comprising an illumination aperture, said lens aperture and a complex lens aperture so as to render a matrix of transmission cross coefficients.

13. The method according to claim 12, wherein said reference diffraction coefficient is formulated as an optimization problem, wherein said optimization problem comprises:
providing a relationship between said matrix of transmission cross coefficients and mask transmittance coefficients, so as to calculate a matrix of aerial image coefficients;
determining said matrix of aerial image coefficients; and
optimizing said reference diffraction coefficient using said matrix of aerial image coefficients.

14. The method according to claim 13, wherein said step of optimizing said reference diffraction coefficient is performed for different exposure conditions.

15. The method according to claim 14, wherein said different exposure conditions include successive defocused illuminations.

16. The method according to claim 13, wherein said matrix of transmission cross coefficients is further used to optimize said illumination source parameter.

17. The method according to claim 1, wherein the step of providing said optimized reference diffraction coefficient comprises:
globally optimizing a simplified merit function;
locally optimizing to refine a global solution; and
combining selected source directions, source intensities and a mask within a lithographic projection system.

18. A method of making a semiconductor device, the method comprising:
providing the photolithographic mask made using the method of claim 1;
providing a semiconductor wafer having a layer of photo resist;
irradiating the layer of photo resist through the photolithographic mask;
removing portions of the photo resist; and
effecting the semiconductor wafer in accordance with the removed portions of the photo resist.

19. A method for making a photolithographic mask, the method comprising:
providing a desired layout pattern, said desired layout pattern comprising at least one structural feature;
providing an imaging model of a photolithographic apparatus, said imaging model comprising an illumination source parameter of an illumination source of said photolithographic apparatus and a lens aperture;
providing at least one optimized reference diffraction coefficient based on said desired layout pattern and said illumination source parameter of said illumination source for imaging relevant diffraction orders of said illumination source passing said lens aperture;
providing an initial mask geometry, said initial mask geometry being parameterized having polygon-shaped structures and being selected so as to obey a certain mask technology;
providing at least one initial diffraction coefficient based on said initial mask geometry;
providing a relationship between said initial diffraction coefficient and a mask transmittance function during illumination with electromagnetic radiation being emitted by said illumination source;
determining said mask transmittance function based on said initial diffraction coefficient by using said relationship;
providing a further relationship between said optimized reference diffraction coefficient and a reference transmittance function during illumination with electromagnetic radiation being emitted by said illumination source;
determining said reference transmittance function based on said optimized reference diffraction coefficient by using said further relationship;
determining an image error function, said image error function being based on said mask transmittance function and said reference transmittance function;

adding further structural elements as further polygon-shaped structures to said initial mask geometry by minimizing said image error function so as to form a modified mask geometry;

optimizing said modified mask geometry by modifying said polygon-shaped structures and said further polygon-shaped structures so as to form an optimized mask pattern by minimizing a difference between said optimized reference diffraction coefficient and a modified diffraction coefficient being based on the modified mask geometry; and providing said photolithographic mask being patterned in accordance with said optimized mask pattern.

20. The method according to claim 19, wherein said mask transmittance function is chosen to resemble a semi-transparent phase shift mask as the mask technology for said photolithographic mask.

21. The method according to claim 19, wherein said mask transmittance function is chosen to resemble a semi-transparent phase shift mask having at least two areas with different transmittance as the mask technology for said photolithographic mask.

22. The method according to claim 19, wherein said mask transmittance function is chosen to resemble a chrome-less phase shift mask as the mask technology for said photolithographic mask.

23. The method according to claim 22, wherein said mask transmittance function is chosen such that said further structural elements resemble phase shifting auxiliary structures.

24. The method according to claim 19, wherein said mask transmittance function is chosen to resemble a Triton phase shift mask as the mask technology for said photolithographic mask.

25. The method according to claim 19, wherein said mask transmittance function is chosen to resemble a semi-transparent phase shift mask with rim-type elements as the mask technology for said photolithographic mask.

26. The method according to claim 19, wherein said photolithographic mask comprises alternating phase shifting elements along a first direction.

27. The method according to claim 19, wherein said photolithographic mask comprises alternating phase shifting elements along a first direction and a second direction, said first direction and said second direction being substantially perpendicular to each other.

28. A method of making a semiconductor device, the method comprising:
providing the photolithographic mask made using the method of claim 19;
providing a semiconductor wafer having a layer of photo resist;
irradiating the layer of photo resist through the photolithographic mask;
removing portions of the photo resist; and
effecting the semiconductor wafer in accordance with the removed portions of the photo resist.

29. A method for making a photolithographic mask, the method comprising:
providing a desired layout pattern, said desired layout pattern comprising at least one structural feature;
providing a plurality of optimized reference diffraction coefficients as a series of Fourier-coefficients and being based on said desired layout pattern, said optimized reference diffraction coefficients being associated with different diffraction orders;
selecting a subset of optimized reference diffraction coefficients, said subset being determined by a lens aperture of a photolithographic apparatus;
providing an initial mask geometry, said initial mask geometry being parameterized having polygon-shaped structures;
providing a plurality of initial diffraction coefficients as a series of Fourier-coefficients being based on said initial mask geometry;
determining a mask transmittance function being described as a Fourier transformation of said initial diffraction coefficients;
determining a reference transmittance function being described as a Fourier transformation of said subset of optimized reference diffraction coefficients;
determining an image error function, said image error function being based on said mask transmittance function and said reference transmittance function;
adding further structural elements as further polygon-shaped structures to said initial mask geometry by minimizing said image error function so as to form a modified mask geometry;
optimizing said modified mask geometry by modifying said polygon-shaped structures and said further polygon-shaped structures so as to form an optimized mask pattern by minimizing a difference between said subset of optimized reference diffraction coefficients and modified diffraction coefficients being based on the modified mask geometry; and
providing said photolithographic mask being patterned in accordance with said optimized mask pattern.

30. The method according to claim 29, wherein the step of optimizing said modified mask geometry by modifying said polygon-shaped structures and said further polygon-shaped structures so as to form said optimized mask pattern comprises modifying edges of said polygon-shaped structures and introducing additional corners into said polygon-shaped structures.

31. The method according to claim 29, wherein the step of optimizing said modified mask geometry is performed iteratively, so as to minimize said difference between said subset of optimized reference diffraction coefficients and said modified diffraction coefficients being based on the modified mask geometry.

32. A method of making a semiconductor device, the method comprising:
providing the photolithographic mask made using the method of claim 29;
providing a semiconductor wafer having a layer of photo resist;
irradiating the layer of photo resist through the photolithographic mask;
removing portions of the photo resist; and
effecting the semiconductor wafer in accordance with the removed portions of the photo resist.

33. A computer program product for optimizing a photolithographic mask comprising computer readable instructions so as to cause a computer to perform the following steps:
storing a desired layout pattern, said desired layout pattern comprising at least one structural feature;
storing an imaging model of a photolithographic apparatus, said imaging model comprising an illumination source parameter of an illumination source of said photolithographic apparatus and a lens aperture;
storing at least one optimized reference diffraction coefficient based on said desired layout pattern and said illumination source parameter of said illumination source for imaging relevant diffraction orders of said illumination source passing said lens aperture;

storing an initial mask geometry, said initial mask geometry being parameterized having polygon-shaped structures;

storing at least one initial diffraction coefficient based on said initial mask geometry;

determining a difference based on said optimized reference diffraction coefficient and said initial diffraction coefficient;

optimizing said initial mask geometry by modifying said polygon-shaped structures so as to form an optimized mask pattern by minimizing said difference; and storing said optimized mask pattern.

34. The computer program product according to claim 33, wherein said illumination source parameter describes a coherent light source and wherein said reference diffraction coefficient is formulated as a linear optimization problem.

35. The computer program product according to claim 34, wherein said linear optimization problem comprises:

storing a target function, said target function describing a desired image contrast when illuminating said photolithographic mask using said optimized mask geometry;

storing at least one constraint function for said linear optimization problem; and optimizing said initial mask geometry using said constraint function and said target function, wherein said constraint function and said target function are defined as linear functions.

36. The computer program product according to claim 33, wherein said illumination source parameter describes a partially coherent light source and wherein said reference diffraction coefficient is formulated using said imaging model which is further defined by an integral function, said integral function being iteratively calculated using a product comprising an illumination aperture, said lens aperture and a complex lens aperture so as to render a matrix of transmission cross coefficients.

37. The computer program product according to claim 36, wherein said reference diffraction coefficient is formulated as an optimization problem, wherein said optimization problem comprises:

storing a relationship between said matrix of transmission cross coefficients and mask transmittance coefficients, so as to calculate a matrix of aerial image coefficients;

determining said matrix of aerial image coefficients; and optimizing said initial mask geometry using said matrix of aerial image coefficients.

38. A storage medium being readable for a computer and having stored computer readable instructions to perform a program on the computer for optimizing a photolithographic mask with the following steps:

storing a desired layout pattern, said desired layout pattern comprising at least one structural feature;

storing an imaging model of a photolithographic apparatus, said imaging model comprising an illumination source parameter of an illumination source of said photolithographic apparatus and a lens aperture;

storing at least one optimized reference diffraction coefficient based on said desired layout pattern and said illumination source parameter of said illumination source for imaging relevant diffraction orders of said illumination source passing said lens aperture;

storing an initial mask geometry, said initial mask geometry being parameterized having polygon-shaped structures;

storing at least one initial diffraction coefficient based on said initial mask geometry;

determining a difference based on said optimized reference diffraction coefficient and said initial diffraction coefficient;

optimizing said initial mask geometry by modifying said polygon-shaped structures so as to form an optimized mask pattern by minimizing said difference; and storing said optimized mask pattern.

39. A lithographic projection system comprising:

means for providing a desired layout pattern, said desired layout pattern comprising at least one structural feature;

means for providing an imaging model of a photolithographic apparatus, said imaging model comprising an illumination source parameter of an illumination source of said photolithographic apparatus and a lens aperture;

means for providing at least one optimized reference diffraction coefficient based on said desired layout pattern and said illumination source parameter of said illumination source for imaging relevant diffraction orders of said illumination source passing said lens aperture;

means for providing an initial mask geometry, said initial mask geometry being parameterized having polygon-shaped structures;

means for providing at least one initial diffraction coefficient based on said initial mask geometry;

means for determining a difference based on said optimized reference diffraction coefficient and said initial diffraction coefficient;

means for optimizing said initial mask geometry by modifying said polygon-shaped structures so as to form an optimized mask pattern by minimizing said difference;

a photolithographic mask, said photolithographic mask having a translucent substrate and being capable to accommodate at least one structural element being light-attenuating and phase-shifting when illuminated and being fabricated in accordance with said optimized mask pattern;

said substrate being coated with a light sensitive layer; and said photolithographic apparatus comprising said illumination source and being capable of accommodating said substrate and said photolithographic mask in accordance with said optimized mask pattern.

40. The lithographic projection system according to claim 39, further comprising further structural elements within said initial mask geometry.

41. The lithographic projection system according to claim 39, wherein a semi-transparent phase shift mask is used for said photolithographic mask.

42. The lithographic projection system according to claim 39, wherein a semi-transparent phase shift mask having at least two areas with different transmittances is used for said photolithographic mask.

43. The lithographic projection system according to claim 42, wherein said two areas with different transmittances are selected being less than 20%.

44. The lithographic projection system according to claim 39, wherein a chrome less phase shift mask is used for said photolithographic mask.

45. The lithographic projection system according to claim 39, wherein a Triton phase shift mask is used for said photolithographic mask.

46. The lithographic projection system according to claim 39, wherein a semitransparent phase shift mask with rim-type elements is used for said photolithographic mask.

47. The lithographic projection system according to claim 39, wherein said photolithographic mask comprises alternating phase shifting elements along a first direction.

48. A method for optimizing a mask layout pattern, comprising:
   providing a first description of a desired layout pattern using optimized diffraction coefficients, wherein the optimized diffraction coefficients are provided based on the desired layout pattern and an illumination source parameter of an illumination source for imaging relevant diffraction orders of said illumination source passing a lens aperture;
   providing a second description of an initial geometry being parameterized having polygon-shaped structures using initial diffraction coefficients;
   equalizing said first description and said second description by modifying said polygon-shaped structures;
   storing said modified polygon-shaped structures of said initial geometry to store an optimized initial geometry; and
   fabricating a photo mask having structural elements in accordance with said optimized initial geometry.

49. A method for photolithographically patterning a substrate, comprising:
   providing a desired layout pattern, said desired layout pattern comprising at least one structural feature;
   providing an imaging model of a photolithographic apparatus, said imaging model comprising an illumination source parameter of an illumination source of said photolithographic apparatus and a lens aperture;
   providing at least one optimized reference diffraction coefficient based on said desired layout pattern and said illumination source parameter of said illumination source for imaging relevant diffraction orders of said illumination source passing said lens aperture;
   providing an initial mask geometry, said initial mask geometry being parameterized having polygon-shaped structures;
   providing at least one initial diffraction coefficient based on said initial mask geometry;
   determining a difference based on said optimized reference diffraction coefficient and said initial diffraction coefficient;
   optimizing said initial mask geometry by modifying said polygon-shaped structures so as to form an optimized mask pattern by minimizing said difference;
   storing said optimized mask pattern;
   fabricating a photo mask having structural elements in accordance with said optimized mask pattern;
   providing said substrate being coated with a light sensitive layer;
   providing a photolithographic apparatus being capable of accommodating said substrate and said photo mask in accordance with said optimized initial geometry;
   patterning said substrate using said photolithographic apparatus and said photo mask; and
   effecting said substrate in substantial alignment with said patterning.

* * * * *